United States Patent
Kyouda et al.

(10) Patent No.: US 8,111,372 B2
(45) Date of Patent: Feb. 7, 2012

(54) COATING FILM FORMING APPARATUS AND COATING FILM FORMING METHOD FOR IMMERSION LIGHT EXPOSURE

(75) Inventors: Hideharu Kyouda, Koshi (JP); Junichi Kitano, Koshi (JP); Taro Yamamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 384 days.

(21) Appl. No.: 12/515,368

(22) PCT Filed: Nov. 19, 2007

(86) PCT No.: PCT/JP2007/072394
§ 371 (c)(1),
(2), (4) Date: May 18, 2009

(87) PCT Pub. No.: WO2008/065924
PCT Pub. Date: Jun. 5, 2008

(65) Prior Publication Data
US 2010/0073647 A1   Mar. 25, 2010

(30) Foreign Application Priority Data
Nov. 29, 2006   (JP) .................................. 2006-321008

(51) Int. Cl.
*H01L 21/66* (2006.01)
(52) U.S. Cl. .......................................... 355/27; 355/77
(58) Field of Classification Search .................... 355/27, 355/30, 77
See application file for complete search history.

(56) References Cited

U.S. PATENT DOCUMENTS

| | | | |
|---|---|---|---|
| 7,142,300 B2 | 11/2006 | Rosengaus | |
| 2003/0013022 A1* | 1/2003 | Czech et al. | 430/5 |
| 2004/0223141 A1* | 11/2004 | Rosengaus | 356/237.1 |
| 2006/0194155 A1* | 8/2006 | Kawamura et al. | 430/394 |
| 2006/0201423 A1* | 9/2006 | Akimoto et al. | 118/712 |
| 2007/0229789 A1* | 10/2007 | Kawamura | 355/53 |

FOREIGN PATENT DOCUMENTS

| | | |
|---|---|---|
| JP | 2005 33177 | 2/2005 |
| JP | 2006 235230 | 9/2006 |
| JP | 2006 319217 | 11/2006 |
| JP | 2007 266074 | 10/2007 |
| JP | 2007 311734 | 11/2007 |
| WO | 2005 029559 | 3/2005 |

OTHER PUBLICATIONS

Translation for JP 2006-319217 published in 2006.*

* cited by examiner

*Primary Examiner* — Glen Kao
(74) *Attorney, Agent, or Firm* — Oblon, Spivak, McClelland, Maier & Neustadt, L.L.P.

(57) ABSTRACT

A coating film forming apparatus for immersion light exposure includes one or more coating units configured to apply a resist film or a resist film and an additional film onto a substrate, one or more thermally processing units configured to perform a thermal process, a defect eliciting unit configured to perform a process for eliciting a latent defect of a coating film at an edge portion of the substrate, a checking unit configured to check a state of the coating film after the process by the defect eliciting unit, a control section configured to use a check result obtained by the checking unit to make a judgment of the state of the coating film and permit transfer of the substrate to the light exposure apparatus, and a cleaning unit configured to perform cleaning on the substrate before the process by the defect eliciting unit.

11 Claims, 10 Drawing Sheets

COATING FILM FORMING APPARATUS AND COATING FILM FORMING METHOD FOR IMMERSION LIGHT EXPOSURE

TECHNICAL FIELD

The present invention relates to a coating film forming apparatus and coating film forming method for immersion light exposure, which are used for forming a coating film, such as a resist film, on the surface of a substrate, such as a semiconductor wafer, before the immersion light exposure. The immersion light exposure is arranged to perform a light exposure process through a liquid on the resist film on the substrate.

BACKGROUND ART

In the process of manufacturing semiconductor devices, photolithography techniques are used for forming circuit patterns on semiconductor wafers (which will be simply referred to as "wafers", hereinafter), which are treated as target substrates. Where a circuit pattern is formed by use of photolithography, the process steps are performed, as follows. Specifically, a resist liquid is first applied to a wafer to form a resist film. Then, the resist film is irradiated with light to perform light exposure on the resist film in accordance with the circuit pattern. Then, the resist film is subjected to a developing process.

In recent years, the integration degree of semiconductor devices becomes increasingly higher to improve the operation speed and so forth. Accordingly, photolithography techniques are required to increase the miniaturization level of circuit patterns formed on wafers. As a photolithography technique for realizing a high resolution of a 45-nm node level, there has been proposed the following immersion light exposure (for example, see International Publication No. WO 2005/029559). In this immersion light exposure, a light exposure liquid, such as purified water, having a refractive index higher than air is supplied between the wafer and light exposure projection lens. The wavelength of light radiated from the projection lens is shortened by means of the refractive index of the light exposure liquid, so that the line width obtained by the light exposure is decreased. However, the immersion light exposure process brings about several problems in realizing a high resolution of a 45-nm node level where it is utilized alone. Accordingly, studies have been made to combine it with a double patterning technique arranged to perform patterning twice to form a fine pattern.

In the double patterning technique, light exposure needs to be performed twice before etching, so particles generated before the light exposure can be easily carried into the light exposure apparatus. Further, in the immersion light exposure, a light exposure process is performed while a light exposure liquid, such as purified water, is supplied, and so particles can be easily generated in the light exposure apparatus. If particles are present in the immersion light exposure, the immersion light exposure apparatus may be contaminated and thereby deteriorate the light exposure accuracy.

Such particles are generated particularly when defects, such as film peeling, are caused at the wafer edge portion during a process step after formation of a coating film, such as a resist film. Particles generated due to defects at the wafer edge portion contaminate the immersion light exposure apparatus and can not only deteriorate the light exposure accuracy but also copy defects on the front and back sides of wafers.

DISCLOSURE OF INVENTION

An object of the present invention is to provide a coating film forming apparatus and coating film forming method for immersion light exposure, which can prevent an immersion light exposure apparatus from being contaminated with particles due to defects at the edge portion of a target substrate.

Another object of the present invention is to provide a computer readable storage medium that stores a program for executing the coating film forming method.

According to a first aspect of the present invention, there is provided a coating film forming apparatus for immersion light exposure, for forming a coating film comprising a resist film or a resist film and an additional film on a substrate to be fed to an immersion light exposure apparatus configured to perform a light exposure process through a liquid, the coating film forming apparatus comprising: one or more coating units configured to apply the resist film or the resist film and the additional film onto the substrate; one or more thermally processing units configured to perform a thermal process necessary for forming the coating film on the substrate; a checking unit configured to check a state of the coating film at an edge portion of the substrate before the immersion light exposure; and a control section configured to use a check result obtained by the checking unit to make a judgment of whether or not the state of the coating film at the edge portion of the substrate is within an acceptable range, and to permit transfer of the substrate to the light exposure apparatus when the state of the coating film is within the acceptable range.

In the apparatus according to the first aspect, the coating film forming apparatus may further comprise a cleaning unit configured to perform cleaning on the substrate after the coating film is formed and before the substrate is transferred to the light exposure apparatus, and the checking unit is configured to check the substrate after the cleaning in the cleaning unit. The control section may be configured to use a check result obtained by the checking unit to make a judgment on a peeling state of the coating film at an edge portion of the substrate. The coating film forming apparatus may further comprise a unit configured to perform a heat process after the light exposure and a unit configured to perform a developing process.

According to a second aspect of the present invention, there is provided a coating film forming apparatus for immersion light exposure, for forming a coating film comprising a resist film or a resist film and an additional film on a substrate to be fed to an immersion light exposure apparatus configured to perform a light exposure process through a liquid, the coating film forming apparatus comprising: one or more coating units configured to apply the resist film or the resist film and the additional film onto the substrate; one or more thermally processing units configured to perform a thermal process necessary for forming the coating film on the substrate; a defect eliciting unit configured to perform a process for eliciting a latent defect of the coating film at an edge portion of the substrate with the coating film formed thereon; a checking unit configured to check a state of the coating film at an edge portion of the substrate after the process by the defect eliciting unit and before the immersion light exposure; and a control section configured to use a check result obtained by the checking unit to make a judgment of whether or not the state of the coating film at the edge portion of the substrate is within an acceptable range, and to permit transfer of the substrate to the light exposure apparatus when the state of the coating film is within the acceptable range.

In the apparatus according to the second aspect, the coating film forming apparatus may further comprise a cleaning unit configured to perform cleaning on the substrate before the process by the defect eliciting unit. The defect eliciting unit and the cleaning unit may be integrated with each other. The defect eliciting unit may be configured to elicit the latent defect of the coating film at the edge portion of the substrate as peeling of the coating film. The defect eliciting unit may be configured to perform a defect eliciting process under harsher conditions than those for the immersion light exposure process. The defect eliciting unit may be configured to perform a defect eliciting process by supplying high-pressure purified water onto the edge portion of the substrate. The coating film forming apparatus may further comprise a unit configured to perform a heat process after the light exposure and a unit configured to perform a developing process.

According to a third aspect of the present invention, there is provided a coating film forming method for immersion light exposure, for forming a coating film comprising a resist film or a resist film and an additional film on a substrate to be fed to an immersion light exposure apparatus configured to perform a light exposure process through a liquid, the coating film forming method comprising: applying the resist film or the resist film and the additional film onto the substrate; performing a thermal process necessary for forming the coating film on the substrate; performing a check on a state of the coating film at an edge portion of the substrate before the immersion light exposure; using a check result thus obtained to make a judgment of whether or not the state of the coating film at the edge portion of the substrate is within an acceptable range; and permitting transfer of the substrate to the light exposure apparatus when the state of the coating film is within the acceptable range.

In the method according to the third aspect, the coating film forming method may further comprise performing cleaning on the substrate after forming the coating film and before performing the check. The judgment of whether or not the state of the coating film is within an acceptable range may be arranged to use the check result to make a judgment on a peeling state of the coating film.

According to a fourth aspect of the present invention, there is provided a coating film forming method for immersion light exposure, for forming a coating film comprising a resist film or a resist film and an additional film on a substrate to be fed to an immersion light exposure apparatus configured to perform a light exposure process through a liquid, the coating film forming method comprising: applying the resist film or the resist film and the additional film onto the substrate; performing a thermal process necessary for forming the coating film on the substrate; performing a process for eliciting a latent defect of the coating film at an edge portion of the substrate with the coating film formed thereon; performing a check on a state of the coating film at an edge portion of the substrate after the process for eliciting a latent defect and before the immersion light exposure; using a check result thus obtained to make a judgment of whether or not the state of the coating film at the edge portion of the substrate is within an acceptable range; and permitting transfer of the substrate to the light exposure apparatus when the state of the coating film is within the acceptable range.

In the method according to the fourth aspect, the coating film forming method may further comprise performing cleaning on the substrate before the process for eliciting a latent defect. The process for eliciting a latent defect may be arranged to elicit the latent defect of the coating film at the edge portion of the substrate as peeling of the coating film. The process for eliciting a latent defect may be arranged to perform a defect eliciting process under harsher conditions than those for the immersion light exposure process. The process for eliciting a latent defect may be arranged to supply high-pressure purified water onto the edge portion of the substrate.

According to a fifth aspect of the present invention, there is provided a computer readable storage medium that stores a program for execution on a computer to control a coating film forming apparatus for immersion light exposure, wherein the program, when executed, causes the computer to control the coating film forming apparatus for immersion light exposure to perform a coating film forming method for immersion light exposure, the coating film forming method comprising: applying the resist film or the resist film and the additional film onto the substrate; performing a thermal process necessary for forming the coating film on the substrate; performing a check on a state of the coating film at an edge portion of the substrate before the immersion light exposure; using a check result thus obtained to make a judgment of whether or not the state of the coating film at the edge portion of the substrate is within an acceptable range; and permitting transfer of the substrate to the light exposure apparatus when the state of the coating film is within the acceptable range.

According to the present invention, before a substrate with a coating film formed thereon is transferred to a light exposure apparatus, a state of the coating film at an edge portion of the substrate is checked. Then, a judgment is made of whether or not the state is within the acceptable range, and transfer of the substrate to the light exposure apparatus is permitted when the state is within the acceptable range. In this case, the light exposure apparatus is prevented from receiving a substrate including a defect, such as peeling of the coating film, which can generate particles. Consequently, the light exposure apparatus is effectively prevented from suffering particles carried therein and also from generating particles therein. Accordingly, the light exposure apparatus can be prevented from being contaminated with particles that deteriorate the light exposure accuracy and also from copying defects onto the back surface of the substrate.

Further, a substrate with a coating film formed thereon may be processed to elicit a latent defect of the coating film at an edge portion of the substrate before a state of the coating film at an edge portion of the substrate is checked. Then, a judgment is made of whether or not the state is within the acceptable range, and transfer of the substrate to the light exposure apparatus is permitted when the state is within the acceptable range. In this case, even where a substrate includes a latent defect of the coating film at an edge portion of the substrate when the coating film is formed, this substrate can be excluded by the check. Consequently, the light exposure apparatus is prevented from suffering particles generated due to a defect elicited therein. Thus, it is expected that the coating process be performed more reliably.

BEST MODE FOR CARRYING OUT THE INVENTION

Embodiments of the present invention will now be described with reference to the accompanying drawings.

Figure 1:
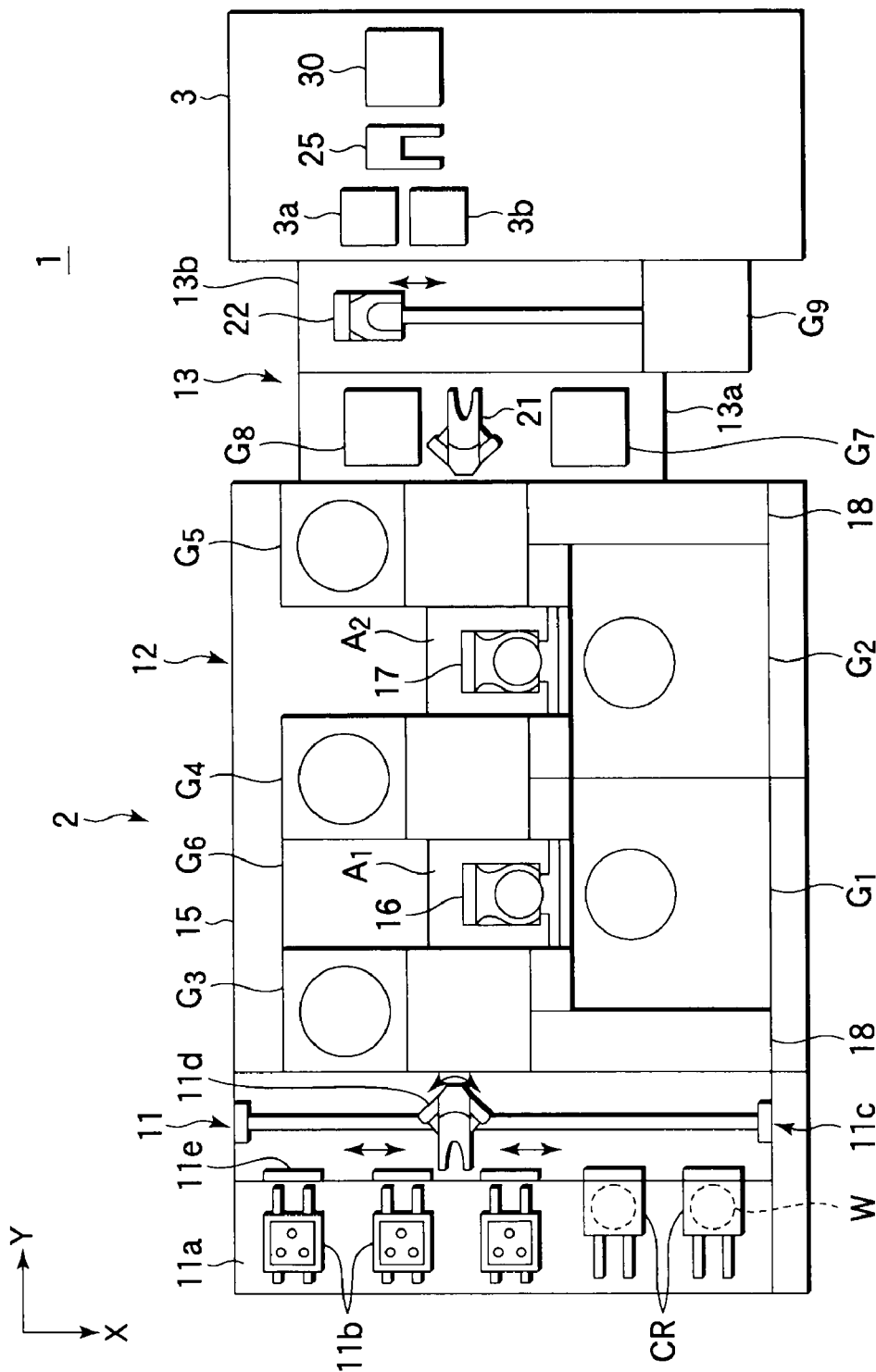
FIG. 1 This is a plan view schematically showing a pattern forming system including a coating/developing apparatus according to an embodiment of the present invention.
Figure 2:
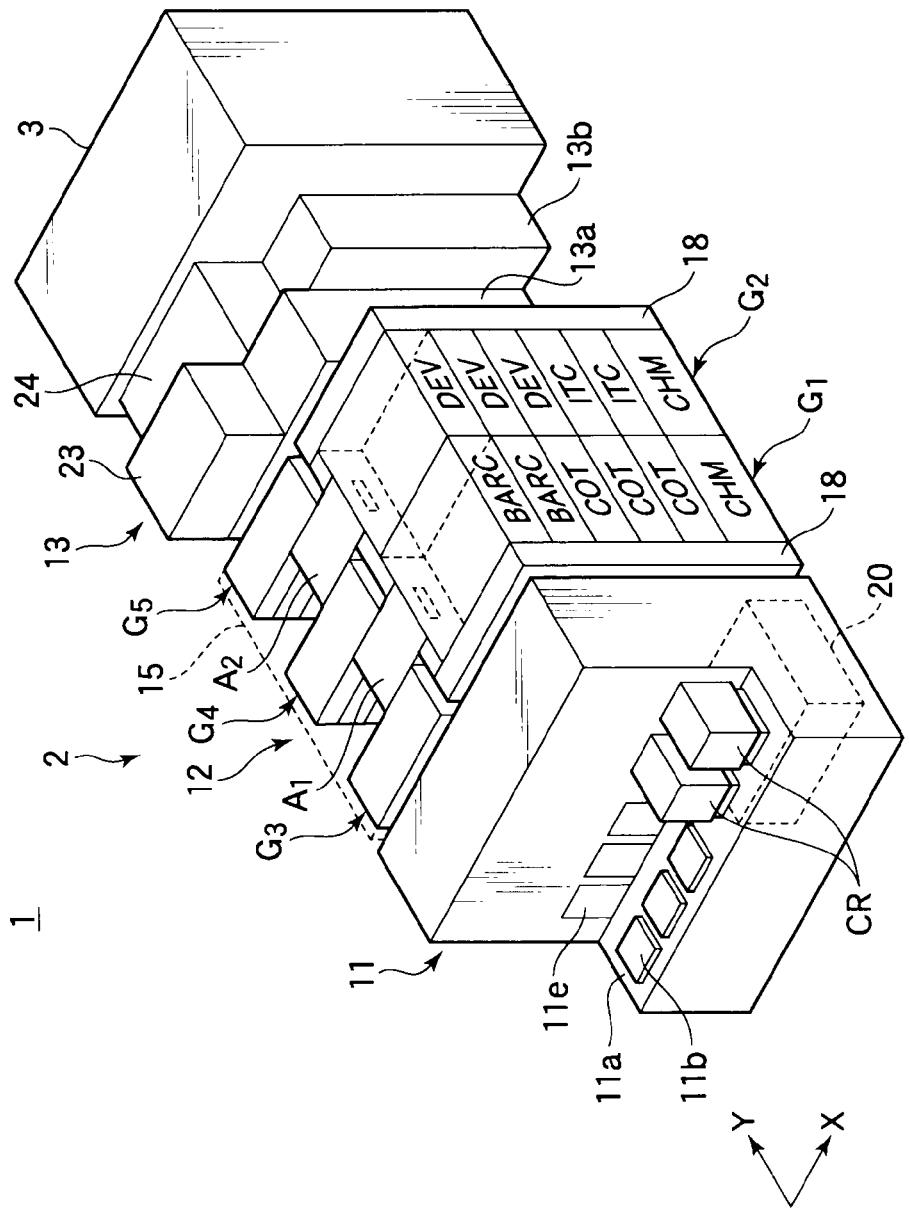
FIG. 2 This is a perspective view schematically showing the pattern forming system shown in FIG. 1.

FIG. 1 is a plan view schematically showing a pattern forming system including a coating/developing apparatus according to an embodiment of the present invention. FIG. 2 is a perspective view schematically showing the pattern forming system.

The pattern forming system 1 is designed to form a predetermined resist pattern on a semiconductor substrate or wafer W. The system includes a coating/developing apparatus 2 for performing resist coating or the like on the wafer W and development after light exposure, and an immersion light exposure apparatus 3 for performing a light exposure process on the wafer W. The coating/developing apparatus 2 includes a cassette station 11 used as a transfer station for wafers W, a process station 12 comprising a plurality of processing units each for performing a predetermined process on a wafer W, and an interface station 13 for transferring wafers W between the process station 12 and light exposure apparatus 3. The cassette station 11, process station 12, interface station 13, and light exposure apparatus 3 are arrayed in series in this order in the longitudinal direction of the pattern forming system 1 (Y-direction).

The cassette station 11 includes a cassette table 11a for placing thereon wafer cassettes (CR) each storing a plurality of, such as 13, wafers W, and a wafer transfer mechanism 11c for transferring wafers W between the wafer cassettes (CR) placed on the cassette table 11a and a transit unit located in a third processing unit group $G_3$ in the process station 12, as described later. The cassette table 11a has a plurality of, such as five, positioning portions 11b each for positioning a wafer cassette (CR), arrayed thereon in the width direction of the pattern forming system 1 (X-direction). A wafer cassette (CR) is placed at each of the positioning portions 20a such that its transfer port faces an opening/closing portion 11e formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the transit unit.

As shown in FIG. 2, a control section 20 is located below the cassette station 11 and is used for controlling the coating/developing apparatus 2, as a whole. The control section 20 will be explained in detail later. The light exposure apparatus 3 also includes a control section (not shown).

The process station 12 is arranged in a casing 15, on the front side of which (lower side in FIG. 1), the process station 12 includes a first processing unit group $G_1$ and a second processing unit group $G_2$ arrayed in this order from the cassette station 11 toward the interface station 13. On the rear side of the casing 15 (upper side in FIG. 1), the process station 12 includes a third processing unit group $G_3$, a fourth processing unit group $G_4$, and a fifth processing unit group $G_5$ arrayed in this order from the cassette station 11 toward the interface station 13. Further, the process station 12 includes a first main transfer section $A_1$ interposed between the third processing unit group $G_3$ and fourth processing unit group $G_4$, and a second main transfer section $A_2$ interposed between the fourth processing unit group $G_4$ and fifth processing unit group $G_5$. Furthermore, the process station 12 includes a sixth processing unit group $G_6$ behind the first main transfer section $A_{11}$.

As shown in FIG. 2, the first processing unit group $G_1$ includes a plurality of processing units stacked one on top of the other, which are formed of two bottom coating units (BARC) for forming an anti-reflective coating film that prevents reflection of light during light exposure on a wafer W, and two resist coating units (COT) for forming a resist film on a wafer W. The second processing unit group $G_2$ includes a plurality of processing units stacked one on top of the other, which are formed of, e.g., three development units (DEV) for performing a developing process on a wafer W, and two top coating units (ITC) for forming a protection film (top coating film) having water repellency on a resist film formed on a wafer W.

Figure 3:
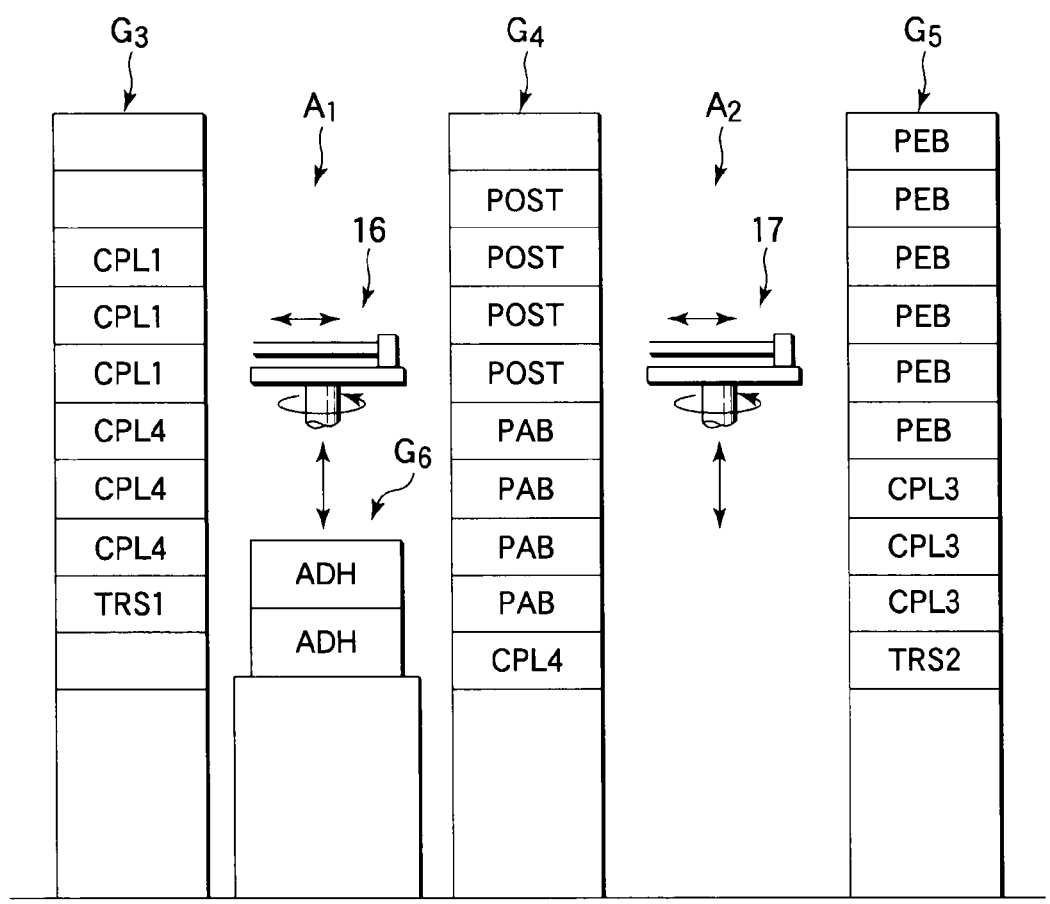
FIG. 3 This is a schematic view for explaining mainly the structure of a third processing unit group $G_3$, a fourth processing unit group $G_4$, and a fifth processing unit group $G_5$ disposed in the coating/developing apparatus of the pattern forming system shown in FIG. 1.

Each of the third processing unit group $G_3$, fourth processing unit group $G_4$, and fifth processing unit group $G_5$ includes a plurality of, such as ten, processing units stacked one on top of the other. These processing units comprise, e.g., a pre-baking unit (PAB) for performing a heating process on a wafer W after resist coating, a post-baking unit (POST) for performing a heating process on a wafer W after the developing process, a post-exposure baking unit (PEB) for performing a heating process on a wafer W after the light exposure and before the developing process, a temperature adjusting unit or cooling unit (CPL1) for adjusting, to a predetermined temperature, a wafer W treated by a hydrophobic process or pre-baking, a temperature adjusting unit or cooling unit (CPL3) for adjusting, to a predetermined temperature, a wafer W heated by the post-exposure baking unit (PEB), a cooling unit (CPL4) for cooling a wafer W heated by the post-baking unit (POST), and so forth. The sixth processing unit group $G_6$ includes, e.g., two processing units stacked one on top of the other, which are formed of adhesion units (ADH) for performing a hydrophobic process on a wafer W. These processing units are arranged as shown in FIG. 3, for example. Further, as shown in FIG. 3, the third processing unit group $G_3$ includes a transit unit (TRS1) used as a relay position for wafers W between the cassette station 11 and first main transfer section $A_1$. The fifth processing unit group $G_5$ includes a transit unit (TRS2) used as a relay position for wafers W between the second main transfer section $A_2$ and a first interface station transfer mechanism 21 disposed in the interface station 13, as described later.

Each of the pre-baking units (PAB) and post-baking units (POST) includes a heating plate, which is accessible by both of the first main transfer section $A_1$ and second main transfer section $A_2$. Each of the post-exposure baking units (PEB) includes a heating plate for heating a wafer W and a cooling plate for cooling a heated wafer, which are accessible by both of the first main transfer section $A_1$ and second main transfer section $A_2$.

The first main transfer section $A_1$ is provided with a first main wafer transfer arm 16 for handling wafers W, which can selectively access the units located in the first processing unit group $G_1$, third processing unit group $G_3$, fourth processing unit group $G_4$, and sixth processing unit group $G_6$. The second main transfer section $A_2$ is provided with a second main wafer transfer arm 17 for handling wafers W, which can selectively access the units located in the second processing unit group $G_2$, fourth processing unit group $G_4$, and fifth processing unit group $G_5$.

Temperature/humidity adjusting units 18 are respectively disposed between the first processing unit group $G_1$ and cassette station 11 and between the second processing unit group $G_2$ and interface station 13 (see FIG. 1). Each of the temperature/humidity adjusting units 18 includes a temperature adjusting device for process liquids to be supplied to the first and second processing unit groups $G_1$ and $G_2$, and a duct for adjustment of temperature and humidity. Chemical units (CHM) are respectively disposed below the first and second processing unit groups $G_1$ and $G_2$, for supplying chemical liquids to the first and second processing unit groups $G_1$ and $G_2$ (see FIG. 2).

Figure 4:
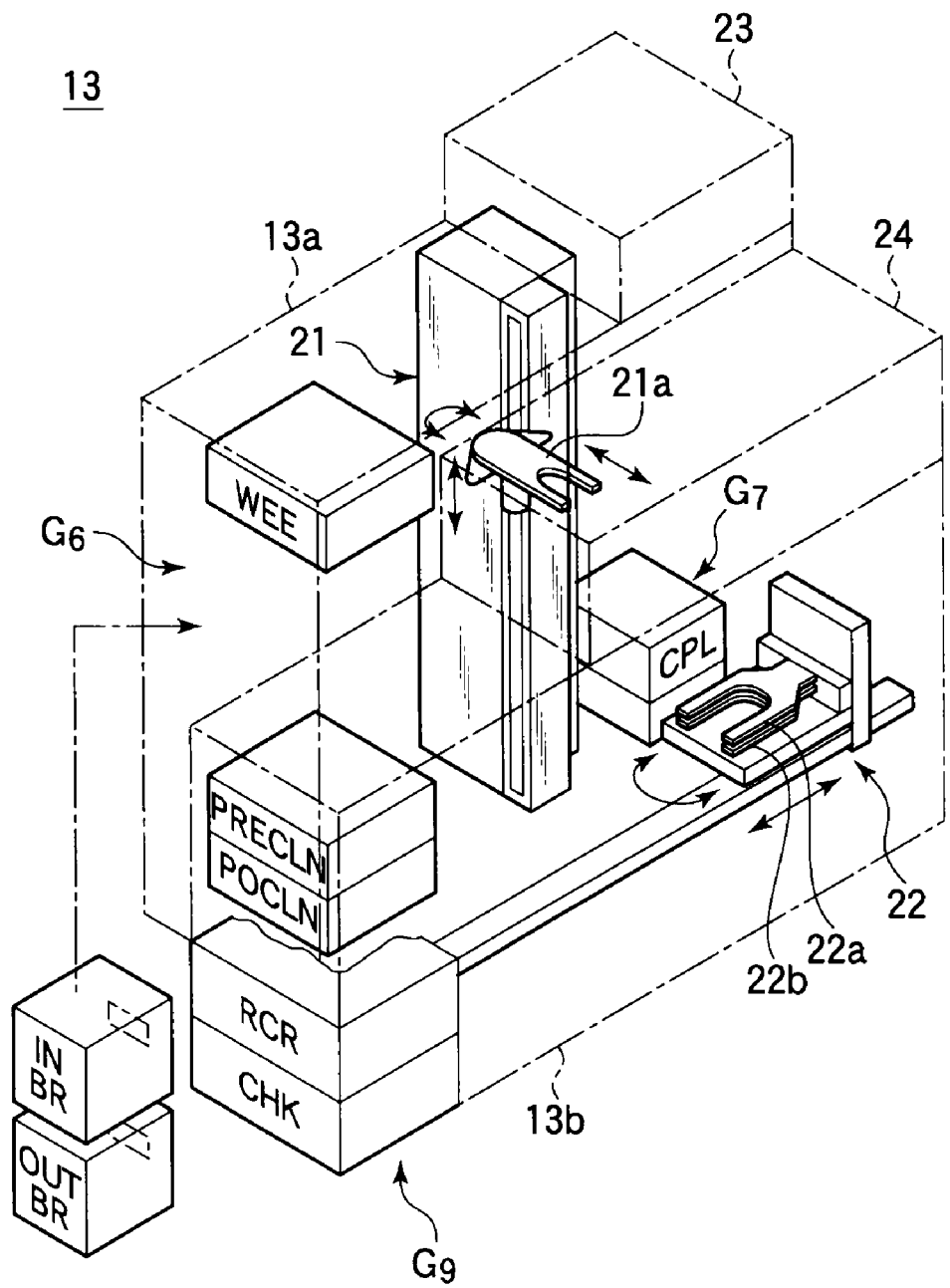
FIG. 4 This is a perspective view schematically showing an interface station disposed in the coating/developing apparatus of the pattern forming system shown in FIG. 1.

As shown in the schematic perspective view of FIG. 4, the interface station 13 is arranged in a casing and includes a first interface station 13a on the process station 12 side and a second interface station 13b on the light exposure apparatus 3 side. The first interface station 13a is provided with a first wafer transfer mechanism 21 for transferring wafers W, disposed to face an opening portion of the fifth processing unit group $G_5$. The second interface station 13b is provided with a second wafer transfer mechanism 22 for transferring wafers W.

A seven processing unit group $G_7$ is located on the front side of the first interface station 13a, and includes several units stacked one on top of the other, which are formed of a periphery light exposure unit (WEE), an incoming buffer cassette (INBR), an outgoing buffer cassette (OUTBR), a pre-cleaning unit (PRECLN), and a post-cleaning unit (POCLN). The periphery light exposure unit (WEE) is used for performing light exposure selectively only on the edge portion of a wafer W to remove an unnecessary resist portion near the wafer edge portion. The incoming buffer cassette (INBR) is used for temporarily placing wafers W to be transferred to the light exposure apparatus 3. The outgoing buffer cassette (OUTBR) is used for temporarily placing wafers W transferred from the light exposure apparatus 3. The pre-cleaning unit (PRECLN) is used for cleaning a wafer W to be transferred to the light exposure apparatus 3. The post-cleaning unit (POCLN) is used for cleaning a wafer W transferred from the light exposure apparatus 3. An eighth processing unit group $G_8$ is located on the rear side of the first interface station 13a, and includes two units stacked one on top of the other, which are formed of high-precision temperature adjusting units (CPL) for adjusting the temperature of a wafer W with high precision.

On the other hand, an ninth processing unit group $G_9$ is located on the front side of the second interface station 13b, and includes two units stacked one on top of the other, which are formed of a checking unit (CHK) for checking the edge portion of a wafer W with a coating film, such as a resist film, formed thereon, and a rejected wafer cassette (RCR) for storing wafers W rejected by the check.

The first wafer transfer mechanism 21 includes a fork 21a for transferring wafers W. The fork 21a is movable up and down and rotatable so that it can selectively access the units located in the fifth processing unit group $G_5$, sixth processing unit group $G_6$, and seventh processing unit group $G_7$ to transfer wafers W between these units.

The second wafer transfer mechanism 22 includes two forks 22a and 22b on the upper and lower sides for transferring wafers W. Each of the forks 22a and 22b is horizontally movable in the Y-direction shown in FIG. 1, movable up and down, and rotatable, so that it can selectively access the pre-cleaning unit (PRECLN) and post-cleaning unit (POCLN) of the seventh processing unit group $G_7$, the units located in the eighth processing unit group $G_8$ and ninth processing unit group $G_9$, and an incoming stage 3a and an outgoing stage 3b of the light exposure apparatus 3 described later to transfer wafers W between these portions.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus 3.

Figure 5:
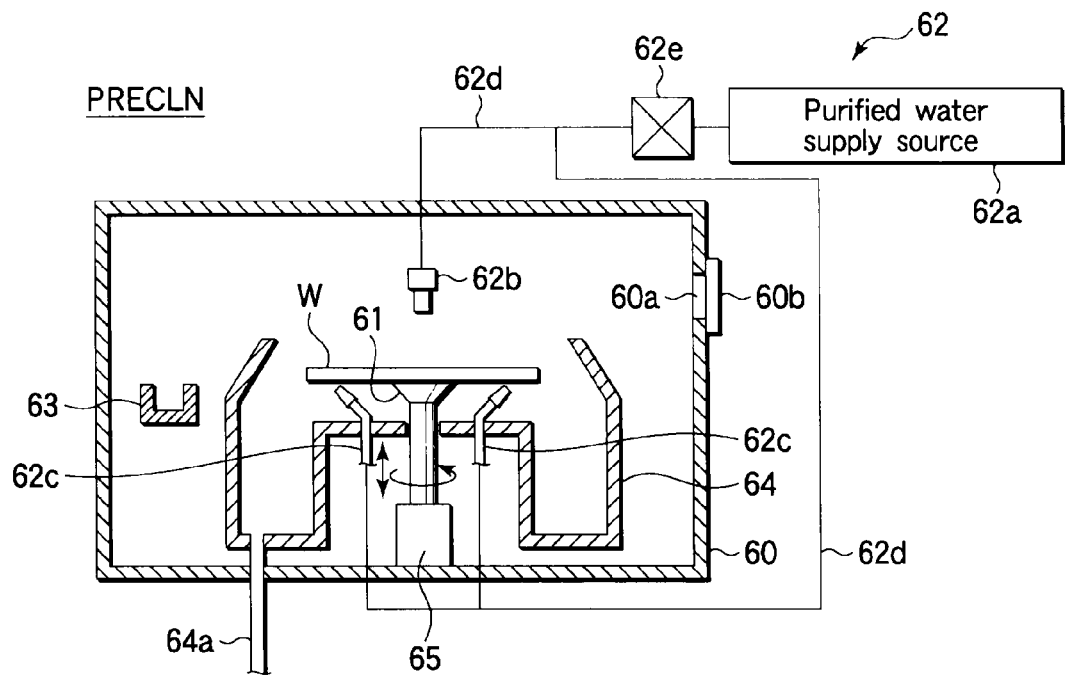
FIG. 5 This is a sectional view schematically showing a pre-cleaning unit disposed in the coating/developing apparatus of the pattern forming system shown in FIG. 1.

As shown in the schematic sectional view of FIG. 5, the pre-cleaning unit (PRECLN) described above includes a casing 60 for accommodating a wafer W. A spin chuck 61 is disposed inside the casing 60 to hold and rotate the wafer W in a horizontal state. A purified water supply mechanism 62 is disposed to supply purified water as a cleaning liquid onto the wafer W held by the spin chuck 61. A cup body 64 is disposed to receive a process liquid, such as a cleaning liquid, thrown off from the wafer W held by the spin chuck 61. A motor 65 is disposed to rotate the spin chuck 61.

The casing 60 has two transfer ports 60a formed in the sidewall for loading/unloading the wafer W therethrough by the first and second transfer mechanisms 21 and 22, respectively. Each of the transfer ports 60a is provided with a shutter 60b. The spin chuck 61 is movable up and down and configured to hold the back surface of the wafer W by a vacuum attraction force while being rotated by the motor 65.

The process liquid supply mechanism 62 includes a purified water supply source 62a for supplying purified water as a cleaning liquid. A front side nozzle 62b is disposed to supply purified water from the purified water supply source 62a onto the front surface (upper surface) of the wafer W held by the spin chuck 61. A back side nozzle 62c is disposed to supply purified water from the purified water supply source 62a onto the back surface (lower surface) of the wafer W held by the spin chuck 61. The purified water from the purified water supply source 62a is supplied through conduits 62d into the front side nozzle 62b and back side nozzle 62c. A valve 62e is disposed to adjust the flow rate of purified water flowing through the conduits 62d. A waiting section 63 is disposed for the front side nozzle 62b to wait thereon.

The cup body 64 is configured to surround the wafer W held by the spin chuck 61 when the spin chuck 61 with the wafer W held thereon is set at a lower position. The cup body 64 has an upper portion inclined inward and upward to reliably receive a process liquid thrown off from the wafer W and a process liquid supplied from the back side nozzle 62c. A drain line 64a is connected to the bottom of the cup body 64 to discharge a process liquid received by the cup body 64.

The post-cleaning unit (POCLN) has the same structure as that of the pre-cleaning unit (PRECLN).

Figure 6:
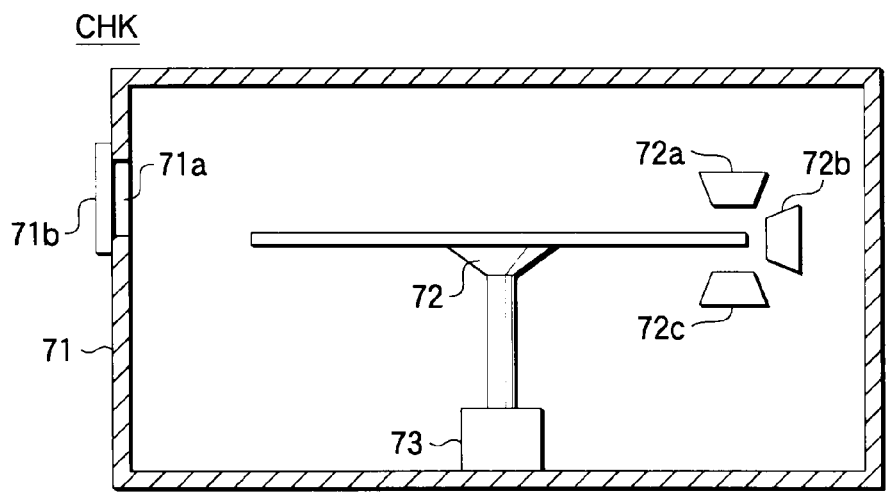
FIG. 6 This is a sectional view schematically showing a checking unit disposed in the coating/developing apparatus of the pattern forming system shown in FIG. 1.

As shown in the schematic structural view of FIG. 6, the checking unit (CHK) includes a casing 71, a spin chuck 72 configured to hold and rotate a wafer W inside the casing 71, and a motor 73 for rotating the spin chuck 72. Three CCD cameras 72a, 72b, and 72c are disposed to pick up images of the front surface edge portion, back surface edge portion, and bevel portion of the wafer W held by the spin chuck 72. These CCD cameras 72a, 72b, and 72c are used to pick up images of edge portions of the wafer W (the front surface edge portion, back surface edge portion, and bevel portion), so that the states of these portions can be known by image data processing of these images. The casing 71 has a wafer transfer port 71a formed in the sidewall and provided with a shutter 71b for opening/closing it. The checking unit (CHK) is used for checking a coating film, such as a resist film, in terms of, e.g., film peeling at the edge portion of the wafer W and the coating state thereof. The CCD cameras 72a, 72b, and 72c may be provided with an element analyzing function to find deposition state of particles.

The light exposure apparatus 3 includes an incoming stage 3a for placing thereon wafers W transferred from the interface station 13, and an outgoing stage 3b for placing thereon wafers W to be transferred to the interface station 13. The light exposure apparatus 3 further includes an immersion light exposure section 30 structured to perform light exposure on a resist film formed on a wafer W while immersing the resist film in a predetermined liquid. A wafer transfer mechanism 25 is disposed to transfer wafers W between the incoming stage 3a, immersion light exposure section 30, and outgoing stage 3b.

Figure 7:
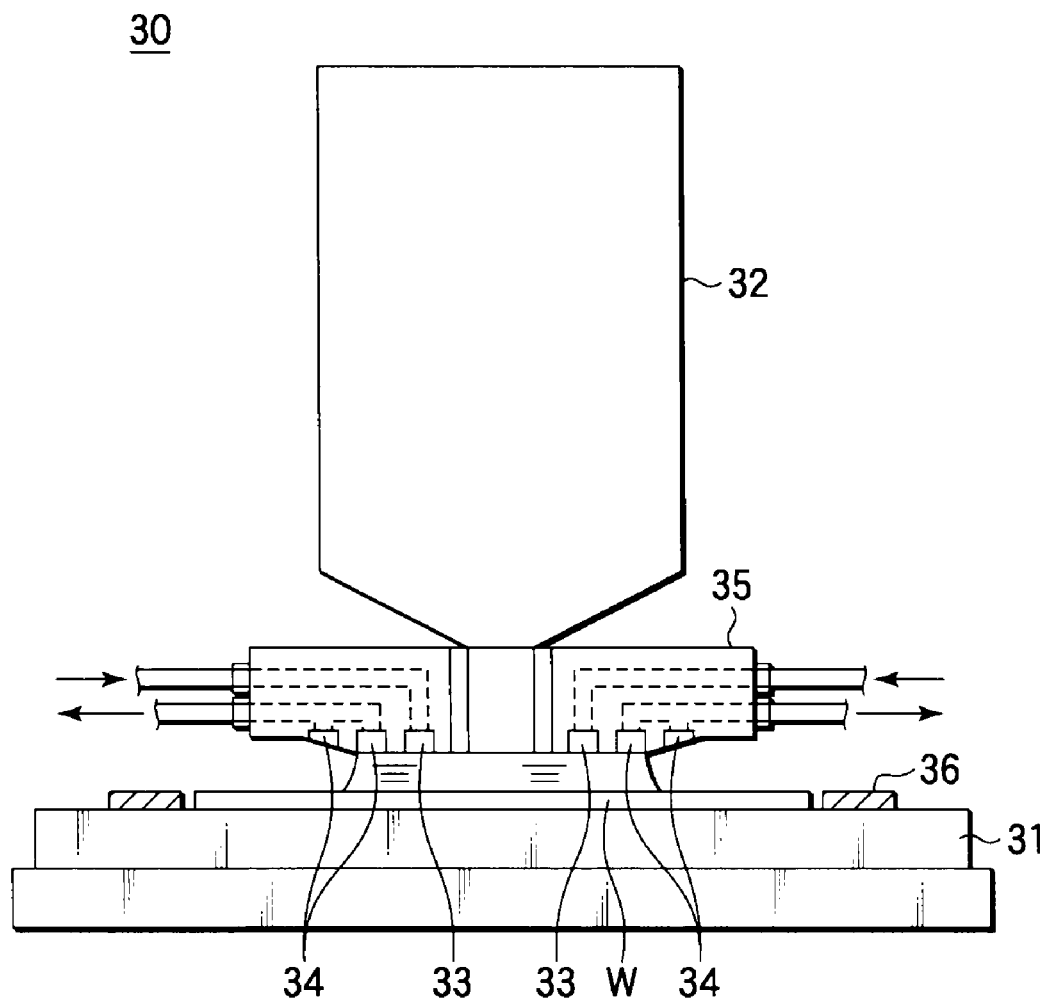
FIG. 7 This is a view schematically showing an example of the structure of an immersion light exposure section disposed in a light exposure apparatus in the pattern forming system shown in FIG. 1.

As shown in the schematic sectional view of FIG. 7, the immersion light exposure section 30 includes an openable chamber (not shown) and a stage 31 located in the chamber for placing thereon a wafer W. A projection lens 32 is disposed to project a mask pattern image, obtained by irradiation with light exposure light from a light source (not shown), onto the wafer W placed on the stage 31 to perform light exposure. Supply ports 33 and collection ports 34 for a light exposure liquid, such as purified water, are formed in a light exposure liquid distribution member 35, such that the light exposure liquid is supplied from the supply ports 33 into the gap between the wafer W placed on the stage 31 and the projection lens 32, and is then collected from the collection ports 34.

The stage 31 is movable in a horizontal direction and slightly rotatable. The stage 31 is provided with an annular projection 36 to surround the wafer W placed thereon, so that the wafer W is held by the annular projection 36, and the light exposure liquid supplied on the wafer W is prevented from flowing out. The projection lens 32 magnifies and projects a mask pattern image at a predetermined magnification onto the wafer W for light exposure. As the light exposure light emitted from the light source, far ultraviolet light, such as KrF excimer laser light, or vacuum ultraviolet light, such as ArF excimer laser light, is used. The light exposure liquid distribution member 35 has an annular shape to surround the distal or lower end of the projection lens 32. The supply ports 33 and collection ports 34 are formed at intervals in annular directions at the bottom of the distribution member 35. The light exposure liquid is supplied from the supply ports 33, and is then collected from the collection ports 34 by means of, e.g., suction.

Figure 8:
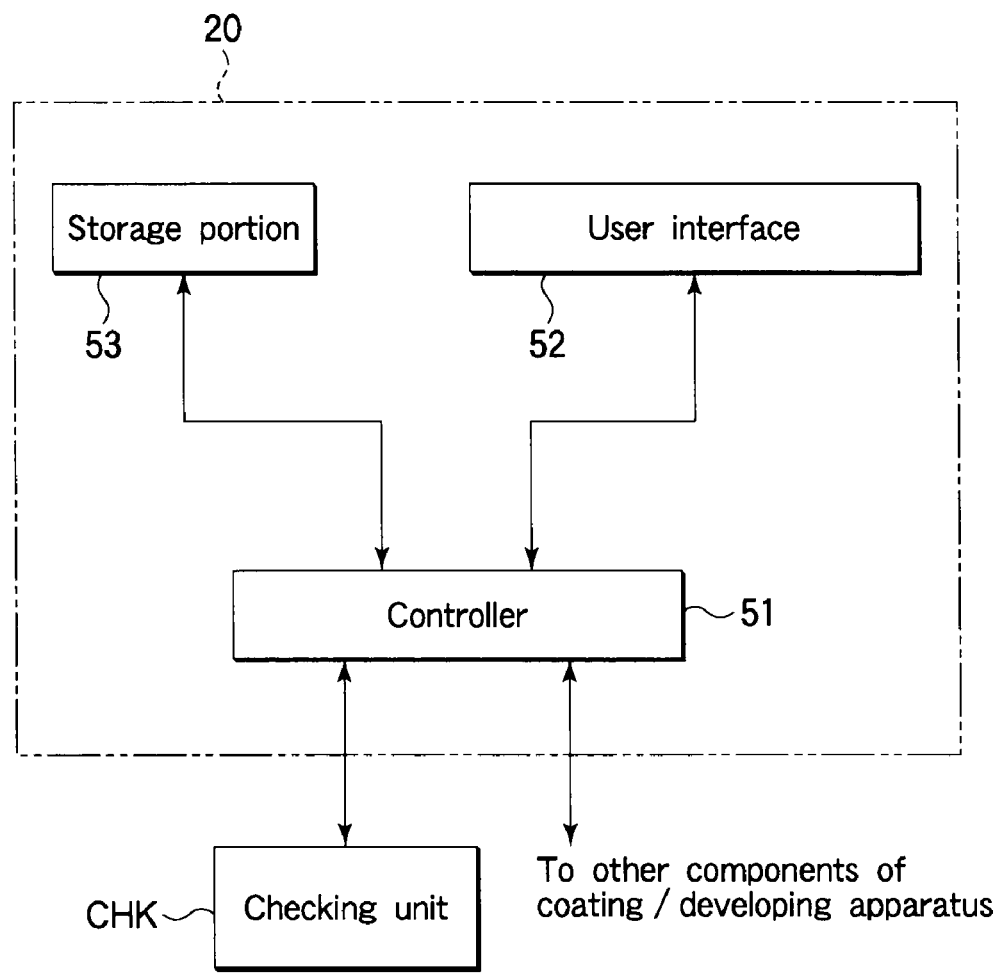
FIG. 8 This is a block diagram showing a main part of a control section used in the coating/developing apparatus of the pattern forming system shown in FIG. 1.

As shown in the block diagram of FIG. 8, the control section 20 includes a controller 51 comprising a micro processor (MPU) for controlling the respective components included in the coating/developing apparatus 2, such as the processing units and transfer mechanisms. The controller 51 is connected to the user interface 52, which includes, e.g., a keyboard and a display, wherein the keyboard is used for an operator to input commands for operating the respective components in the pattern forming system 1, and the display is used for showing visualized images of the operational status of the respective components in the pattern forming system 1. Further, the controller 51 is connected to a storage portion 53, which stores data necessary for processes.

The storage portion 53 stores control programs for realizing various processes performed in the coating/developing apparatus 2 under the control of the controller 51, recipes containing process condition data and process sequences recorded therein, databases necessary for processes, and so forth.

When a process is performed, a required recipe is retrieved from the storage portion 53 and executed by the controller 51 in accordance with an instruction or the like input through the user interface 52. Consequently, each of various predetermined processes is performed in the coating/developing apparatus 2 under the control of the controller 51. Recipes are stored in a computer readable medium, such as a CD-ROM, hard disc, flexible disc, or nonvolatile memory. Alternatively, a recipe may be used online while it is transmitted from a suitable apparatus through, e.g., a dedicated line, as needed.

The controller 51 also has the function of using the check result on an edge portion of the wafer W by the checking unit (CHK) to make a judgment of whether or not the state of the edge portion is within the acceptable range.

Next, an explanation will be given of a process flow in the pattern forming system 1 having the structure described above.

At first, wafers W are taken out one by one from a wafer cassette (CR) by the transfer pick 11d of the wafer transfer mechanism 11c. Each wafer W thus taken out is transferred to the transit unit disposed in the third processing unit group $G_3$ of the process station 12. Then, the wafer W is transferred by the first and second main transfer sections $A_1$ and $A_2$ sequentially through predetermined units in the first to fifth processing unit group $G_1$ to $G_5$, so that the wafer W is subjected to a series of processes in accordance with the order prescribed in a recipe. For example, the wafer W is sequentially subjected to an adhesion process in one of the adhesion units (ADH), formation of an anti-reflective coating film in one of the bottom coating units (BARC), formation of a resist film in one of the resist coating units (COT), formation of a protection film in one of the top coating units (ITC), and a pre-baking process in one of the pre-baking units (PAB). Thereafter, the wafer W is transferred by the first wafer transfer mechanism 21 in the interface station 13, in which the wafer W is sequentially subjected to a periphery light exposure process in the periphery light exposure unit (WEE), and to a pre-cleaning process in the pre-cleaning unit (PRECLN).

In the pre-cleaning unit (PRECLN), the wafer W transferred therein is held by a vacuum attraction force on the spin chuck 61 set at the upper position. Then, the transfer port 60a is closed by the shutter 60b and the spin chuck 61 is moved down so that the wafer W is surrounded by the cup body 64. Then, while the wafer W is rotated by the spin chuck 61, purified water is supplied from the purified water supply mechanism 62 onto the wafer W to perform cleaning on the wafer W. Then, the supply of purified water is stopped and the wafer W is rotated by the spin chuck 61 to perform a throwing off and drying operation. After the drying operation, the transfer port 60b is opened and the wafer W is transferred out by the second wafer transfer mechanism 22.

Then, the wafer W is transferred into the high-precision temperature adjusting unit (CPL), in which the wafer W is adjusted to a predetermined temperature with high precision. Then, the wafer W is transferred by the second wafer transfer mechanism 22 to the incoming stage 3a of the light exposure apparatus 3. Then, the wafer W is transferred by the wafer transfer mechanism 25 of the light exposure apparatus 3 to the immersion light exposure section 30, in which the wafer W is subjected to an immersion light exposure process.

Thereafter, the wafer W is transferred by the wafer transfer mechanism 25 to the outgoing stage 3b. Then, the wafer W is transferred by the second wafer transfer mechanism 22 of the interface station 13 into the post-cleaning unit (POCLN), in which the wafer W is subjected to post-cleaning. Then, the wafer W is transferred by the first and second main transfer sections $A_1$ and $A_2$ from the transit unit of the fifth processing unit group $G_5$ sequentially through predetermined units in the first to fifth processing unit group $G_1$ to $G_5$ in accordance with the order prescribed in the recipe. For example, the wafer W is sequentially subjected to a post-exposure baking process in one of the post-exposure baking units, a developing process in one of the development units (DEV), and a post-baking process in one of the post-baking units. Thereafter, the wafer W is transferred through the transit unit of the third processing unit group $G_3$ into a wafer cassette (CR) placed in the cassette station 11.

In the wafer processes described above, when a coating film, such as the anti-reflective coating film, resist film, or protection film, is formed in the coating/developing apparatus 2, the edge portion of the wafer W may suffer defect portions, such as peeling and undesirable coating of the coating film. Then, in the light exposure apparatus 3, when the light exposure head and wafer W are moved relative to each other while a light exposure liquid, typically purified water, is held between the light exposure head and wafer W, the defect portions may separate from the wafer W and generate particles due to an impact shock at this time. Further, when purified water is supplied in the pre-cleaning unit (PRECLN), particles may be generated from the defect portion and carried over to the light exposure apparatus.

Figure 9:
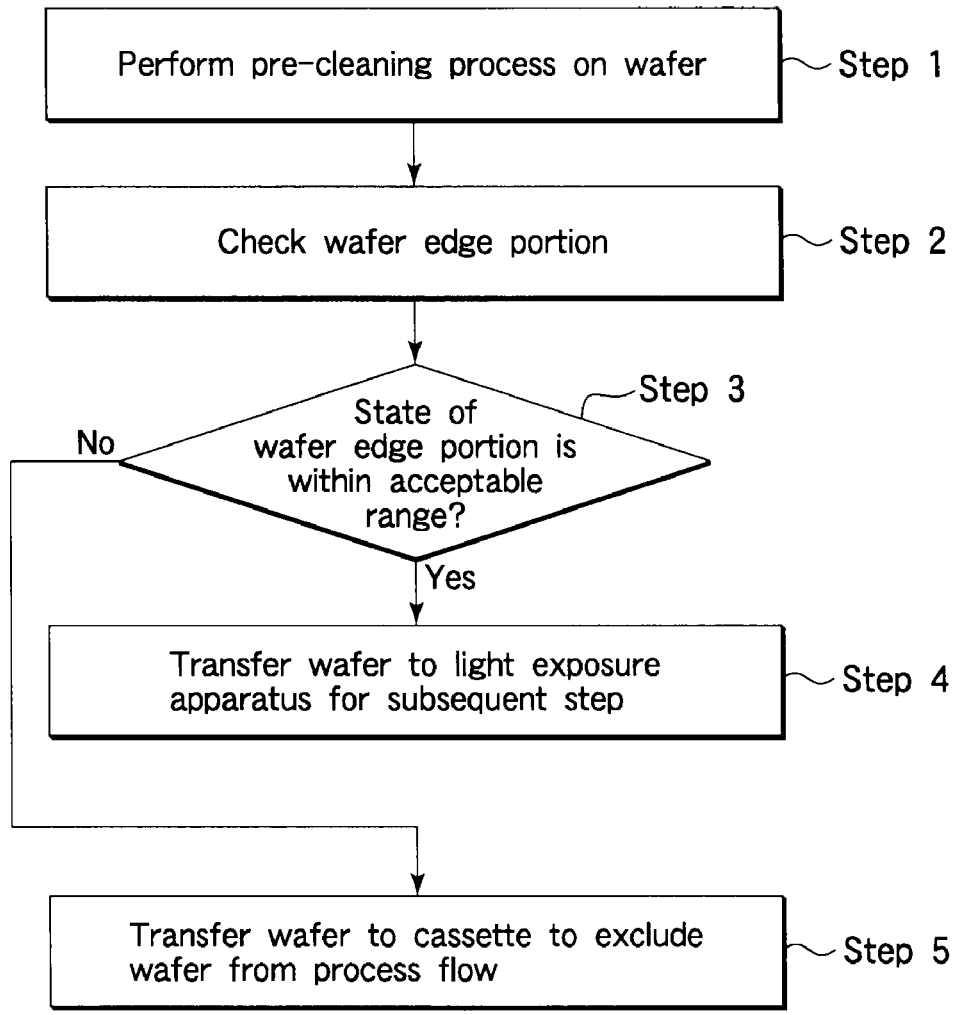
FIG. 9 This is a flow chart showing a process flow comprising a check on the wafer edge portion and steps before and after the check, used in the coating/developing apparatus according to an embodiment of the present invention.

In light of these problems, according to this embodiment, before the wafer W is transferred from the coating/developing apparatus 2 to the light exposure apparatus 3, and preferably after cleaning is performed prior to the light exposure, the edge state of the wafer W is checked. Next, a detailed explanation will be given of a process flow comprising this check and steps before and after the check, with reference to the flow chart shown in FIG. 9.

After the necessary coating processes are completed in accordance with the sequence described above, the wafer W is subjected to a pre-cleaning process in the pre-cleaning unit (PRECLN) (Step 1). Then, the wafer W is transferred from the pre-cleaning unit (PRECLN) into the checking unit (CHK), in which the edge portion of the wafer W is checked (Step 2). In this check on the edge portion, the three CCD camera 72a, 72b, and 72c are used to pick up images of the wafer W from its front surface edge portion, back surface edge portion, and bevel portion, while the wafer W is held on the spin chuck 72 and slowly rotated. Then, these images are treated by image data processing to grasp the presence of film peeling and the coating state.

Then, the result of this check obtained by the checking unit (CHK) is output to the controller 51 of the control section 20 to make a judgment of whether or not the edge portion state of the wafer W is within an acceptable range (Step 3). When the edge portion state of the wafer W is within the acceptable range, the wafer W is transferred to the light exposure apparatus 3 for the subsequent step (Step 4). Specifically, the wafer W is transferred into the high-precision temperature adjusting unit (CPL), and is then transferred to the incoming stage 3a of the light exposure apparatus 3. On the other hand, when the edge portion state of the wafer W is out of the acceptable range, the wafer W is transferred into the rejected wafer cassette (RCR) above the checking unit (CHK), and is thereby excluded from the process flow (Step 5). The wafer W thus excluded may be reworked for reuse or may be discarded.

As described above, before a wafer W is transferred to the light exposure apparatus 3, the edge state of the wafer W is checked, so that, only when the edge state is within an acceptable range, the wafer is transferred to the light exposure apparatus 3. Consequently, the light exposure apparatus 3 is prevented from suffering particles due to edge defects and also from generating particles therein. Accordingly, the light exposure apparatus 3 is effectively prevented from being contaminated with particles and also from copying defects onto the front and back surfaces of the wafer W. Particularly, since this check is performed after pre-cleaning for the light exposure, defects elicited by the cleaning at the edge portion of the wafer W can also be found by the checking unit (CHK), and so the effect is improved. Further, since undesirable wafers W are excluded in the middle of the sequential processes, there is no need to perform unnecessary processes, thereby improving the process efficiency.

Next, an explanation will be given of an alternative embodiment of the present invention.

In the embodiment described above, after the cleaning process is performed in the pre-cleaning unit (PRECLN), the edge portion of the wafer W is checked in the checking unit (CHK), so that, only when the edge state is within an acceptable range, the wafer is transferred to the light exposure apparatus 3. However, the edge portion of a wafer W may include latent defects, with which a coating film defect may be elicited as peeling or the like at the edge portion and bring about particles, even if the wafer W passes the check in the checking unit (CHK).

Figure 10:
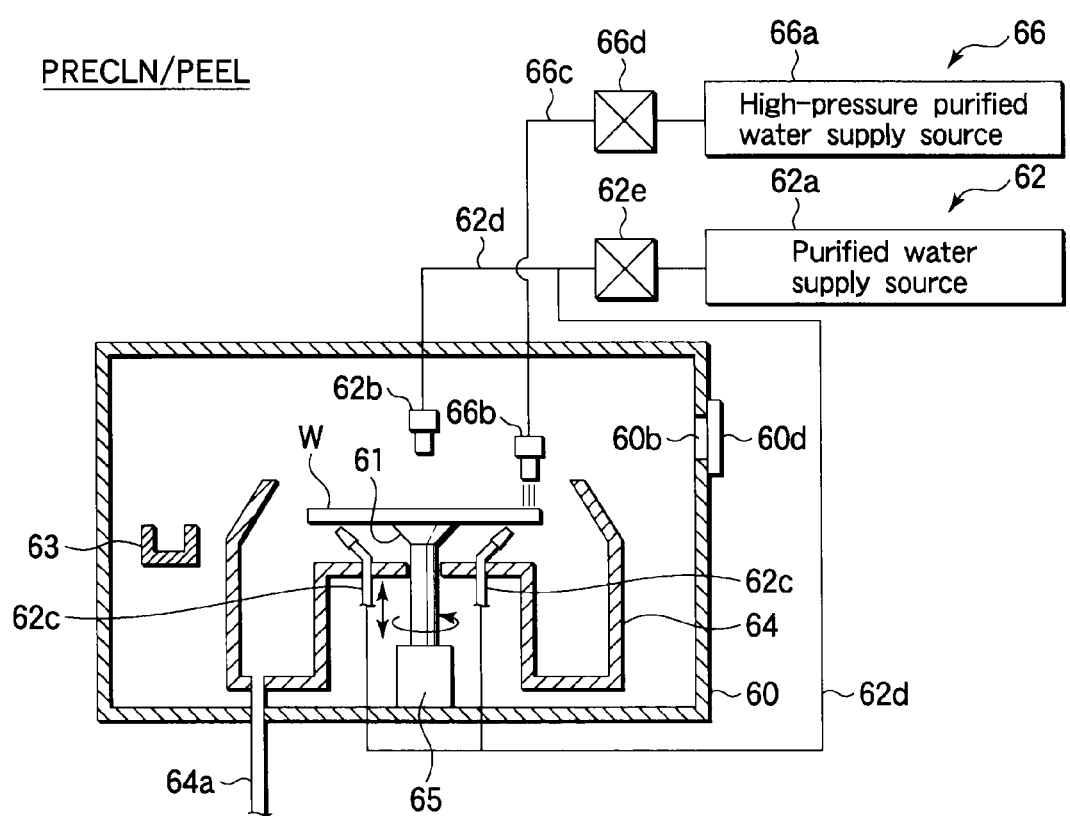
FIG. 10 This is a sectional view schematically showing a pre-cleaning/peel-eliciting unit disposed in a coating/developing apparatus according to an alternative embodiment of the present invention.

In light of this problem, according to this embodiment, a pre-cleaning/peel-eliciting unit (PRECLN/PEEL) is disposed in place of the pre-cleaning unit (PRECLN). FIG. 10 is a sectional view schematically showing the pre-cleaning/peel-eliciting unit (PRECLN/PEEL). This pre-cleaning/peel-eliciting unit (PRECLN/PEEL) includes a function as a pre-cleaning unit (PRECLN), which has the same basic structure as that of the pre-cleaning unit (PRECLN) described above, but differs in that it can supply high-pressure purified water onto the edge portion of a wafer W. Specifically, in addition to the structural components of the pre-cleaning unit (PRECLN), the pre-cleaning/peel-eliciting unit (PRECLN/PEEL) includes a high-pressure purified water supply mechanism 66 for supplying high-pressure purified water onto the front surface edge portion of the spin chuck 61. The high-pressure purified water supply mechanism 66 includes a high-pressure purified water supply source 66a. A high-pressure purified water nozzle 66b is disposed to spray high-pressure purified water onto the front surface edge portion of the wafer W. A conduit 66c is disposed to supply the high-pressure purified water from the high-pressure purified water supply source 66a to the high-pressure purified water nozzle 66b. A valve 66d is disposed to adjust the flow rate of the purified water flowing through the conduit 66c. The other components of this unit are the same as those of the cleaning unit (PRECLN), and thus their explanation will be omitted while they are denoted by the same reference numerals as those of the cleaning unit (PRECLN).

In the pre-cleaning/peel-eliciting unit (PRECLN/PEEL), the pressure and flow rate of purified water supplied from the high-pressure purified water nozzle 66b are preset to provide harsher conditions than those used for the immersion light exposure process, with which the high-pressure purified water is supplied onto the edge portion of a wafer W after the pre-cleaning process is performed on the wafer W. Consequently, where a wafer W includes no defect of a coating film observed so far at the edge portion, but includes a defect that can be elicited as peeling or the like at the edge portion during the immersion light exposure, the defect is forcibly elicited at the edge portion of the wafer W.

Figure 11:
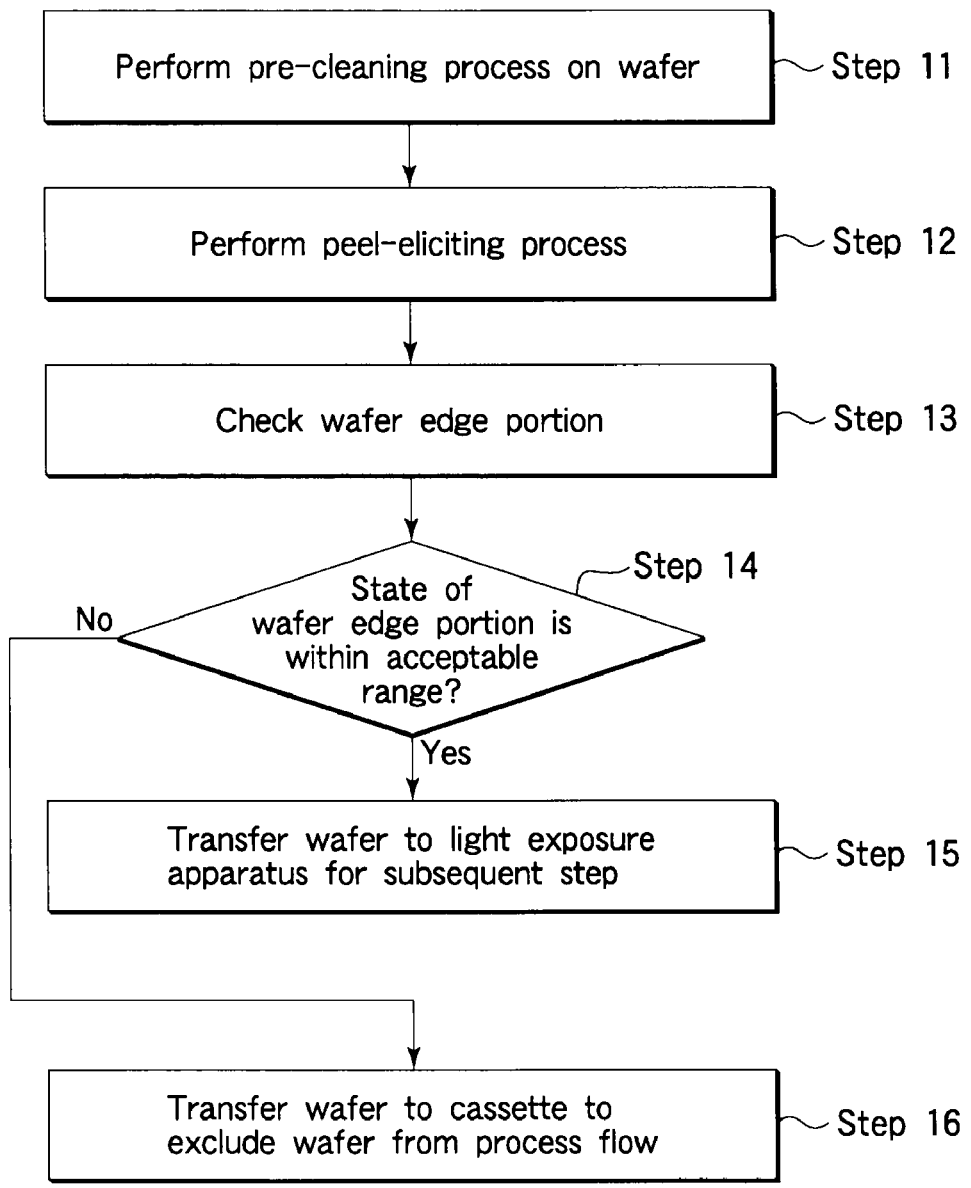
FIG. 11 This is a flow chart showing a process flow comprising a check on the wafer edge portion and steps before and after the check, used in the coating/developing apparatus according to the alternative embodiment of the present invention.

Next, an explanation will be given of a process flow comprising the check and steps before and after the check according to this embodiment, with reference to the flow chart shown in FIG. 11.

After the necessary coating processes are completed in accordance with the sequence described above, the wafer W is subjected to a pre-cleaning process in the pre-cleaning/peel-eliciting unit (PRECLN/PEEL) (Step 11). Then, also in the pre-cleaning/peel-eliciting unit (PRECLN/PEEL), the high-pressure purified water is supplied onto the edge portion of the wafer W to elicit latent peeling at the edge portion, if any (Step 12). Then, the wafer W is transferred from the pre-cleaning/peel-eliciting unit (PRECLN/PEEL) into the checking unit (CHK), in which the edge portion of the wafer W is checked (Step 13). In this check on the edge portion, as described above, the three CCD camera 72a, 72b, and 72c are used to pick up images of the wafer W from its front surface edge portion, back surface edge portion, and bevel portion, while the wafer W is held on the spin chuck 72 and slowly rotated. Then, these images are treated by image data processing to grasp the presence of film peeling and the coating state.

Then, the result of this check obtained by the checking unit (CHK) is output to the controller 51 of the control section 20 to make a judgment of whether or not the edge portion state of the wafer W is within an acceptable range (Step 14). When the edge portion state of the wafer W is within the acceptable range, the wafer W is transferred to the light exposure apparatus 3 for the subsequent step (Step 15). Specifically, the wafer W is transferred into the high-precision temperature adjusting unit (CPL), and is then transferred to the incoming stage 3a of the light exposure apparatus 3. On the other hand, when the edge portion state of the wafer W is out of the acceptable range, the wafer W is transferred into the rejected wafer cassette (RCR) above the checking unit (CHK), and is thereby excluded from the process flow (Step 16). The wafer W thus excluded may be reworked for reuse or may be discarded.

As described above, before a wafer W is checked in the checking unit (CHK), the high-pressure purified water is supplied (sprayed) onto the edge portion of the wafer W in the pre-cleaning/peel-eliciting unit (PRECLN/PEEL). In this case, in addition to the effects of the former embodiment, it is possible to forcibly elicit latent peeling that is not observed so far but will be elicited during the immersion light exposure. Consequently, the light exposure apparatus 3 is more effectively prevented from suffering particles generated therein, and thus is improved in reliability.

It should be noted that a unit for performing the peel-eliciting process and a unit for performing the pre-cleaning process may be disposed independently of each other. Further, the peel-eliciting process may be performed by another method, e.g., by blowing gas in place of purified water or by blushing the target.

The present invention has been described with reference to typical embodiments, but the present invention is not limited to the embodiments described above, and it may be modified in various manners. For example, in the embodiments described above, the present invention is applied to a coating/developing apparatus, but it may be applied to an apparatus for performing only a coating process and processes associated therewith. In the embodiments described above, a checking unit is configured to check the edge portion by CCD cameras, but the checking unit may be configured to use another checking member. In the embodiments described above, the check is performed before the light exposure and immediately after the cleaning process, but the check can be performed with any timing after the coating process and before the light exposure. In the embodiments described above, the controller is preset to make a judgment of whether or not a check result obtained by the checking unit is within an acceptable range. Alternatively, a check image may be utilized for operators to judge the check result.

The invention claimed is:

1. A coating film forming apparatus for immersion light exposure, for forming a coating film comprising a resist film or a resist film and an additional film on a substrate to be fed to an immersion light exposure apparatus configured to perform a light exposure process through a liquid, the coating film forming apparatus comprising:
    one or more coating units configured to apply the resist film or the resist film and the additional film onto the substrate;
    one or more thermally processing units configured to perform a thermal process necessary for forming the coating film on the substrate;
    a defect eliciting unit configured to perform a process for eliciting a latent defect of the coating film at an edge portion of the substrate with the coating film formed thereon;
    a checking unit configured to check a state of the coating film at an edge portion of the substrate after the process by the defect eliciting unit and before the immersion light exposure;
    a control section configured to use a check result obtained by the checking unit to make a judgment of whether or not the state of the coating film at the edge portion of the substrate is within an acceptable range, and to permit transfer of the substrate to the light exposure apparatus when the state of the coating film is within the acceptable range; and
    a cleaning unit configured to perform cleaning on the substrate before the process by the defect eliciting unit.

2. The coating film forming apparatus for immersion light exposure according to claim 1, wherein the defect eliciting unit and the cleaning unit are integrated with each other.

3. The coating film forming apparatus for immersion light exposure according to claim 1, wherein the defect eliciting unit is configured to elicit the latent defect of the coating film at the edge portion of the substrate as peeling of the coating film.

4. The coating film forming apparatus for immersion light exposure according to claim 1, wherein the defect eliciting unit is configured to perform a defect eliciting process under harsher conditions than those for the immersion light exposure process.

5. The coating film forming apparatus for immersion light exposure according to claim 1, wherein the defect eliciting unit is configured to perform a defect eliciting process by supplying high-pressure purified water onto the edge portion of the substrate.

6. The coating film forming apparatus for immersion light exposure according to claim 1, wherein the coating film forming apparatus further comprises a unit configured to perform a heat process after the light exposure and a unit configured to perform a developing process.

7. A coating film forming method for immersion light exposure, for forming a coating film comprising a resist film or a resist film and an additional film on a substrate to be fed to an immersion light exposure apparatus configured to perform a light exposure process through a liquid, the coating film forming method comprising:
- applying the resist film or the resist film and the additional film onto the substrate;
- performing a thermal process necessary for forming the coating film on the substrate;
- performing a process for eliciting a latent defect of the coating film at an edge portion of the substrate with the coating film formed thereon;
- performing a check on a state of the coating film at an edge portion of the substrate after the process for eliciting a latent defect and before the immersion light exposure;
- using a check result thus obtained to make a judgment of whether or not the state of the coating film at the edge portion of the substrate is within an acceptable range;
- permitting transfer of the substrate to the light exposure apparatus when the state of the coating film is within the acceptable range; and
- performing cleaning on the substrate before the process for eliciting a latent defect.

8. The coating film forming method for immersion light exposure according to claim 7, wherein the process for eliciting a latent defect is arranged to elicit the latent defect of the coating film at the edge portion of the substrate as peeling of the coating film.

9. The coating film forming method for immersion light exposure according to claim 7, wherein the process for eliciting a latent defect is arranged to perform a defect eliciting process under harsher conditions than those for the immersion light exposure process.

10. The coating film forming method for immersion light exposure according to claim 7, wherein the process for eliciting a latent defect is arranged to supply high-pressure purified water onto the edge portion of the substrate.

11. A non-transitory computer readable storage medium that stores a program for execution on a computer to control a coating film forming apparatus for immersion light exposure, wherein the program, when executed, causes the computer to control the coating film forming apparatus for immersion light exposure to conduct a sequence for forming a coating film comprising a resist film or a resist film and an additional film on a substrate to be fed to an immersion light exposure apparatus configured to perform a light exposure process through a liquid, the sequence comprising:
- applying the resist film or the resist film and the additional film onto the substrate;
- performing a thermal process necessary for forming the coating film on the substrate;
- performing a process for eliciting a latent defect of the coating film at an edge portion of the substrate with the coating film formed thereon;
- performing a check on a state of the coating film at an edge portion of the substrate after the process for eliciting a latent defect and before the immersion light exposure;
- using a check result thus obtained to make a judgment of whether or not the state of the coating film at the edge portion of the substrate is within an acceptable range;
- permitting transfer of the substrate to the light exposure apparatus when the state of the coating film is within the acceptable range; and
- performing cleaning on the substrate before the process for eliciting a latent defect.

* * * * *